(12) United States Patent
Kong et al.

(10) Patent No.: US 10,935,584 B2
(45) Date of Patent: Mar. 2, 2021

(54) SYSTEM AND METHOD FOR DETERMINING BEAM DYNAMICS AND MULTI-USER PERFORMANCE OF BASE STATION

(71) Applicant: Keysight Technologies, Inc., Santa Rosa, CA (US)

(72) Inventors: Hong-Wei Kong, Beijing (CN); Ya Jing, Beijing (CN); Zhu Wen, Beijing (CN)

(73) Assignee: Keysight Technologies, Inc., Santa Rosa, CA (US)

(*) Notice: Subject to any disclaimer, the term of this patent is extended or adjusted under 35 U.S.C. 154(b) by 0 days.

(21) Appl. No.: 16/551,240

(22) Filed: Aug. 26, 2019

(65) Prior Publication Data
US 2020/0209296 A1 Jul. 2, 2020

(51) Int. Cl.
| H04B 17/00 | (2015.01) |
| G01R 29/08 | (2006.01) |
| G01R 29/10 | (2006.01) |
| H04B 17/10 | (2015.01) |
| H04B 7/06 | (2006.01) |
| H04B 7/0452 | (2017.01) |
| H04B 17/309 | (2015.01) |

(Continued)

(52) U.S. Cl.
CPC ......... *G01R 29/0878* (2013.01); *G01R 29/10* (2013.01); *H04B 7/0452* (2013.01); *H04B 7/0639* (2013.01); *H04B 7/0695* (2013.01); *H04B 17/102* (2015.01); *H04B 17/101* (2015.01); *H04B 17/15* (2015.01); *H04B 17/309* (2015.01); *H04B 17/391* (2015.01)

(58) Field of Classification Search
CPC ...... H04B 17/00; H04B 17/101; H04B 17/15; H04B 17/309; H04B 17/391
See application file for complete search history.

(56) References Cited

U.S. PATENT DOCUMENTS

| 9,859,995 B2 | 1/2018 | Kong et al. | |
| 10,033,473 B1 * | 7/2018 | Kyrolainen | ............ H04B 17/15 |

(Continued)

OTHER PUBLICATIONS

"Radiated Power and Phase Calibration of a Multichannel Signal Transmitter", IP.com No. IPCOM000249094D, IP.com Electronic Publication Date: Feb. 3, 2017, 1-10 pgs.

*Primary Examiner* — Thuy Vinh Tran (57) ABSTRACT

A system and a method to determine beam dynamics and multi-user performance of a base station having an antenna array including multiple antenna elements are disclosed. The system includes a measurement probe antenna positioned in a mid-field of the antenna array, a reference antenna having a fixed position with respect to the base station antenna array, and a coupling probe array including multiple coupling probe antennas positioned in a reactive field of the base station antenna array for coupling RF signals of the antenna elements to selected coupling probe antennas to form a high dimension radiation channel matrix between the antenna array and the coupling probe array. The system further includes a channel emulator configured to receive the measured antenna element patterns from the measurement probe antenna, to receive the RF signals coupled to the selected coupling probe antennas, to provide bi-directional channel models of channels between the base station and user devices.

20 Claims, 2 Drawing Sheets

(51) Int. Cl.
*H04B 17/15* (2015.01)
*H04B 17/391* (2015.01)

(56) References Cited

U.S. PATENT DOCUMENTS

| | | | |
|---|---|---|---|
| 10,601,695 B2* | 3/2020 | Kyosti | .................... H04L 43/50 |
| 2017/0373773 A1 | 12/2017 | Jing et al. | |
| 2019/0158162 A1* | 5/2019 | Ryu | ..................... H04B 7/0682 |
| 2019/0190624 A1* | 6/2019 | Kyosti | ................. H04B 7/0413 |

* cited by examiner

FIG.1

SYSTEM AND METHOD FOR DETERMINING BEAM DYNAMICS AND MULTI-USER PERFORMANCE OF BASE STATION

CROSS REFERENCE TO RELATED APPLICATIONS

The present application claims priority under 35 U.S.C. § 119(e) to Chinese Patent Application No. 201811608473.4, filed on Dec. 26, 2018. The entire disclosure of U.S. Provisional Application Chinese Patent Application No. 201811608473.4 is hereby specifically incorporated by reference in its entirety.

BACKGROUND

For implementation of $5^{th}$ generation (5G) networks, massive multiple-input multiple-output (MIMO) technology is key. Using massive MIMO antennas, a base station is able to form spatially separated narrow beams pointing to different user equipment (UE), such as cellular phones and other wireless mobile devices, at different locations, respectively. The narrow beams enable spatial multiple access by the UEs, and enlarges network capacity, as well as the spectrum efficiency. However, to really benefit from the spatially separated narrow beams, the base station and each UE need to have a mechanism to find the right beam used for communicating between the base station and the UE, and to control the beam to continuously track movement of the UE. The base station also needs to make real-time decisions on whether support different UEs using different beams or the same beam. Such determinations for performance of the base station may be made using algorithms, together with a radio frequency (RF) frontend and an antenna array. Therefore, test solutions are needed to test the base station's beam dynamics and multi-user performance over-the-air (OTA). Such test solutions are different from previous cellular communication systems, without massive MIMO technology, since there was no need to test the beam dynamics, and the multi-user performance test was done in cable conducted way, meaning that base station's RF ports were directly connected to the channel emulator RF ports using RF cables.

Conventional solutions for OTA testing are aimed primarily at single antenna measurements. However, with the advent of millimeter wave (mmW) bands and corresponding wireless communication standards, such as IEEE 802.11ad, as well as the advent of 5G networks, cost, size and speed become key attributes of test methodology. To characterize performance, various attributes of the DUT, such as radiation profile, effective isotropic radiated power, total radiated power, error-vector-magnitude (EVM) of the modulation, and adjacent channel leakage ratios (ACLRs), for example, are characterized as a function of beam angle. Currently, this involves a very time-consuming process. For example, characterizing just the radiation profiles of a DUT as a function of beam angle may take hours.

Antenna characterization processes typically take place either at an outdoor test range or in an anechoic chamber. Outdoor test ranges are used for antennas having a very long far-field (e.g., greater than 5 m), rendering use of an indoor test range or anechoic chamber impractical. Anechoic chambers are shielded, including walls covered in absorbing material that minimizes internal reflections, typically by several tens of decibels.

There are a number of basic conventional techniques for antenna characterization using an anechoic chamber, such as a simple-far-field measurement technique for an antenna having a far-field that occurs at a sufficiently short distance that it can be measured directly in a chamber of practical size, and a near-field measurement technique, according to which near-field measurements are mathematically transformed to the far-field. Another conventional technique uses a compact antenna test range (CATR), where an approximately uniform source (a single antenna) illuminates a curved mirror where the resulting reflection is collimated. In this way, the DUT with a long far-field distance may be positioned in the collimated beam, and the DUT antenna's radiation pattern may be determined as the received power changes as a function of rotation angle (elevation and azimuth) of the DUT. The collimated reflection from the curved mirror allows the DUT to be characterized in the far-field in a more compact chamber than would otherwise be possible without the curved mirror.

As mentioned above, mmWave bands are being used in 5G networks in order to obtain wide enough bandwidth to enable high throughput. The high frequency bands tend to have high path loss, which generally requires use of antenna arrays to achieve higher antenna gain to offset the effects of the high path loss. Phased arrays (referred to herein as "phased antenna arrays" or simply "antenna arrays") are commonly used in devices for these high frequency bands, including both user equipment (UE) and base stations, such as eNodeBs/gNodeBs. In order to make the beamforming (BF) process efficient for antenna arrays, hybrid beamforming may be implemented. According to hybrid beamforming, techniques used in analog as well as digital beamforming are combined. 5G systems at higher frequencies (mmWave) apply integrated analog beamforming with a fast dynamic beam switching procedure, which may be tested OTA when RF-antenna connectors at each antenna element are not available. Both base station and UE may apply analog beamforming.

A more practical approach which can let the customer test the base station beam dynamics and multi-user performance over the air is needed.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree to one of ordinary skill in the art. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

According to various embodiments, a test system and method are provided to enable OTA testing of beam dynamics of a massive MIMO base station and multi-user performance. Generally, the massive MIMO base station having a base station antenna array formed of antenna elements, and a massive low reflection, low mutual coupling probe array having coupling probe antennas are located within an anechoic chamber. The coupling probe array is used to couple RF signals of the base station's antenna elements out to RF connectors of the channel emulator to form a high dimension radiation channel matrix between the base station antenna array and the coupling probe array connected to the channel emulator via RF switches. This is through reactive coupling among the antenna elements of the base station antenna array and the probe antenna elements of the probe antenna array. The radiation channel matrix is invertible, and the corresponding inversion matrix is applied by the channel emulator to achieve massive wireless cabling connections between the base station antenna elements and the coupling probe antennas.

Also, bi-directional channel models are provided by the channel emulator which model channels between the base station antenna elements and user devices (including actual or emulated UEs), respectively, using the RF signals, coupled to the probe antenna array and provided in the form of the inversion matrix. That is, the base station antenna element patterns follow the inversion matrix, and the channel models for the user devices in various scenarios and the UE antenna patterns follow the channel models. Generally, the bi-directional channel models are after the inversion matrix and consist of the following, in sequence: the base station antenna element patterns, the channel models for the scenarios where the user devices are located, and the UE antenna patterns.

In addition, the antenna element patterns (antenna patterns) of the antenna elements in the base station antenna array are measured by a measurement probe antenna positioned in a mid-field of the base station antenna array, also within the anechoic chamber. The measured antenna element patterns and UE antenna patterns are loaded into the channel emulator, and are joint emulated with the bi-directional channel models for the user devices, entirely in the channel emulator. The joint emulation provides bi-directional spatial channel emulation for each of the individual user devices to the base station, enabling measurement by the channel emulator of beam dynamics of the antenna elements in the base station antenna array and interference among the user devices.

Figure 1:
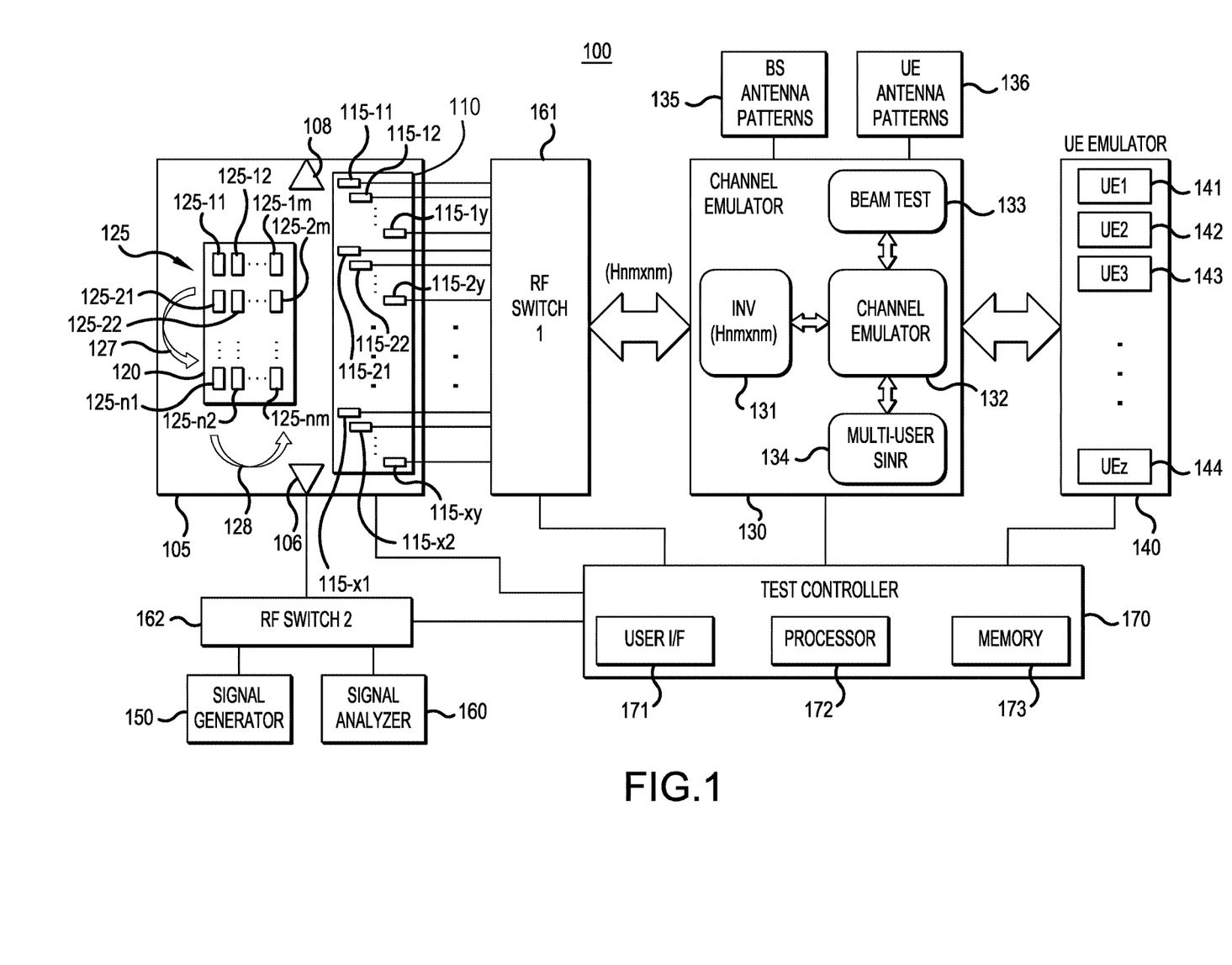
FIG. 1 is a simplified block diagram of a test system for performing over-the-air (OTA) testing of a DUT having an antenna array within an anechoic chamber, according to representative embodiments.

FIG. 1 is a simplified block diagram of a test system for performing OTA testing of a DUT having an antenna array within an anechoic chamber, according to representative embodiments. Generally, the test system is configured for determining beam dynamics and the multi-user performance of the DUT (e.g., a massive MIMO base station) in an anechoic chamber.

Referring to FIG. 1, test system 100 includes an anechoic chamber 105, a measurement probe antenna 106, a reference antenna 108, a channel emulator 130, a user equipment (UE) emulator 140, a signal generator 150, a signal analyzer 160, and a test controller 170. The anechoic chamber 105 houses a device under test (DUT), indicated for purposes of illustration as massive MIMO base station 120, and a coupling probe array 110. The base station 120 (e.g., an LTE base station or 5G base station) has a beamforming circuit, and includes a base station antenna array 125. The base station antenna array 125 includes multiple antenna elements, indicated by illustrative antenna elements 125-11 to 125-$nm$, arranged in the form of a matrix. That is, there are m antenna elements in each row and n antenna elements in each column of the base station antenna array 125, where n and m are positive integers that may be the same as or different from one another.

In an embodiment, the base station 120 is mounted on a multi-dimensional positioner (or rotator), indicated by arrows 127 and 128 in FIG. 1. The multi-dimensional positioner is configured to dynamically position the base station 120 in three dimensions to enable measurement of antenna element patterns of the antenna elements 125-11 to 125-$nm$ in the base station antenna array 125, respectively. For example, each of the antenna elements 125-11 to 125-$nm$ many be consecutively positioned at a rotation center of the anechoic chamber 105 for a corresponding antenna element pattern measurement, discussed below. The orientation of the multi-dimensional positioner may be controlled by the test controller 170, for example, or by a separate controller (not shown) dedicated to positioning of the base station 120. In an alternative embodiment, the antenna element pattern of each of the antenna elements 125-11 to 125-$nm$ in the base station antenna array 125 is measured without the antenna element 125-11 to 125-$nm$ being physically positioned at a rotation center of the anechoic chamber 105 by mathematically correcting for offset of the antenna element 125-11 to 125-$nm$ from the rotation center. The mathematical correction may be performed at the channel emulator 130 or the test controller 170, for example.

The anechoic chamber 105 further houses the measurement probe antenna 106, the reference antenna 108, and the coupling probe array 110 for receiving RF signals from (and transmitting RF signal to) the base station antenna array 125. The test system 100 further includes a first RF switch 161 and a second RF switch 162, which may be implemented as switch multiplexers, for example. The first RF switch 161 selectively connects selected ones of illustrative coupling probe antennas 115-11 to 115-*xy* of the coupling probe array 110 to the channel emulator 130, and the second RF switch 162 selectively connects the measurement probe antenna 106 to one of a signal generator 150 or a signal analyzer 160, as discussed below. According, the first RF switch 161 may be an xy by nm interconnection switch, for example, where xy is the total number of coupling probe antennas and nm is the total number of the base station antenna elements.

The measurement probe antenna 106 is positioned in a mid-field of the base station 120. That is, a distance between the measurement probe antenna 106 and the base station 120 is in a far-field of each of the antenna elements 125-11 to 125-*nm*, and in a near-field of the base station antenna array 125. The measurement probe antenna 106 provides measurement signals for measuring transmit and receive antenna element patterns of the antenna elements 125-11 to 125-*nm* in the base station antenna array 125, respectively, as discussed below. When the antenna element patterns are being measured using the measurement probe antenna 106, the coupling probe array 110 is put aside and/or blocked by absorbers to avoid interference with the antenna element pattern measurement.

For example, in the depicted embodiment, the second RF switch 162 may be configured to selectively connect the measurement probe antenna 106 to the signal generator 150 for receive testing of the antenna element patterns, and to the signal analyzer 160 for transmit testing of the antenna element patterns. Operation of the second RF switch 162 may be performed by the test controller 170. The signal generator 150 is configured for generating the measurement signals to be transmitted by the measurement probe antenna 106 to the antenna elements 125-11 to 125-*nm* in the base station antenna array 125 to perform the receive testing of the antenna element patterns. The base station 120 reports to the test controller 170, for example, received signal strength for each of the antenna elements 125-11 to 125-*nm* and relative phase between the antenna elements 125-11 to 125-*nm* (discussed below). The signal analyzer 160 is configured for measuring the measurement signals from the measurement probe antenna 106, as well as measuring the reference signal from the reference antenna 108, to obtain amplitude and phase for each of the antenna elements 125-11 to 125-*nm* of the base station antenna array 125 for the transmit testing of the antenna element patterns. The second RF switch 162 may be a 2×2 interconnection switch, for example, where 2 is for the two polarizations of the measurement probe antenna 106, and the other 2 is for the signal generator 150 and the signal analyzer 160, respectively.

When one RF input drives multiple antenna elements 125-11 to 125-*nm* with fixed phase, the antenna elements 125-11 to 125-*nm* may be treated effectively as one antenna element, and only their combined antenna pattern needs to be measured. When one RF input drives multiple antenna elements 125-11 to 125-*nm* through a phase shift network (not shown), and the phase shift network is configured to perform dynamic adjustment during operation of the base station 120, then the antenna elements 125-11 to 125-*nn* are treated as different antenna elements and an antenna element pattern for each of the antenna elements needs to be measured.

The reference antenna 108 has a fixed position with respect to the base station antenna array 125, and is configured to provide a reference signal used as a phase reference for determining phase information of the antenna elements 125-11 to 125-*nm* of the base station antenna array 125. The reference signal may be the signal radiated by a base station antenna element, which is received by the reference antenna 108 and then received by the signal analyzer 160. The reference antenna 108 is used to measure the base station transmit antenna element pattern. The phase information may be provided to the test controller 170, for example, for measuring the antenna element patterns, respectively. A phase difference between each of the measurement signals from the measurement probe antenna 106 and the reference signal from the reference antenna 108 is a phase difference for an antenna element of the antenna elements 125-11 to 125-*nm* at different directions with a fixed offset. Accordingly, the reference antenna 108 enables determination of the complex antenna patterns of the antenna elements 125-11 to 125-*nm*, such that each antenna element pattern is a complex antenna pattern, having both amplitude and phase patterns.

The coupling probe array 110 includes multiple coupling probe antennas, indicated by the illustrative coupling probe antennas 115-11 to 115-*xy*, arranged in the form of a matrix. That is, there are x coupling probe antennas in each row and y coupling probe antennas in each column of the coupling probe array 110, where x and y are positive integers. In various embodiments, x and y may be equal to or different from one another. The coupling probe array 110 may have half wavelength spacing between adjacent coupling probe antennas 115-11 to 115-*xy* for both horizontal and vertical dimensions for a given frequency. Further, the coupling probe array 110 may be low reflection and low intrusive to the field it is measuring, such that a very small amount of power is coupled out.

The coupling probe antennas 115-11 to 115-*xy* may be dual-polarized probes, for example, although other types of coupling probe antennas, or groups of coupling probe antennas, may be incorporated without departing from the scope of the present teachings. Reference to the coupling probe antennas 115-11 to 115-*xy* is intended to cover each of these configurations. Also, although the coupling probe array 110 is shown on a flat surface, it is understood that this depiction is not limiting, and that the coupling probe antennas 115-11 to 115-*xy* may be arranged on other types of surfaces, such as a substantially parabolic shaped surface, without departing from the scope of the present teachings.

The coupling probe array 110 is placed in a reactive field of the base station antenna array 125. The reactive field is within distance R of the plurality of antenna elements in the base station antenna array, and where $$R = 0.62\sqrt{\frac{D^3}{\lambda}},$$

D being an antenna array aperture size and λ being wavelength of the RF signals. The coupling probe array 110 is configured to couple the RF signals to and/or from the antenna elements 125-11 to 125-*nm* in the base station antenna array 125 (uplink and/or downlink), over-the-air, from and/or to some of the coupling probe antennas 115-11 to 115-*xy*, respectively. That is, for the uplink, the coupling probe array 110 couples signals from the coupling probe antennas 115-11 to 115-*xy* to the base station antenna elements 125-11 to 126-*nm*. For the downlink, the coupling probe array 110 couples signals from the base station antenna elements 125-11 to 126-*nm* to the coupling probe antennas 115-11 to 115-*xy*. Coupling the RF signals with the antenna elements 125-11 to 125-*nn* forms a high dimension nm by nm (nm×nm) radiation channel matrix H (Hnm×nm) between the base station antenna array 125 and the coupling probe array 110.

In an embodiment, the number of coupling probe antennas 115-11 to 115-*xy* in the coupling probe array 110 is larger than the number of antenna elements 125-11 to 125-*nm* in the base station antenna array 125. Therefore, different sets of coupling probe antennas may be chosen from among a large number of coupling probe antennas 115-11 to 115-*xy* when testing the base station antenna array 125 with different geometry parameters. Accordingly, a well conditioned radiation channel matrix Hnm×nm is more likely to be achieved.

The channel emulator 130 as shown in FIG. 1 includes a number of blocks, which indicate respective software or programming functions. For example, the channel emulator 130 includes inversion matrix ($H^{-1}$ nm×nm) block 131, channel emulation block 132, beam test block 133 and multi-user signal to interference noise ratio (SINR) block 134. It is understood that, in an embodiment, the channel emulator 130 may be a processing device or multiple processing devices programmed to implement the functions described herein. For example, the channel emulator 130 may be implemented using one or more processors, such as a computer processor, application specific integrated circuits (ASICs), field-programmable gate arrays (FPGAs), or combinations thereof, using software, firmware, hard-wired logic circuits, or combinations thereof. A computer processor(s), in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a central processing unit (CPU), for example, executing an operating system. Also, in an embodiment, the functionality of the channel emulator 130 may be implemented as a computer program or computer software and/or instructions executable by a separate computing device, such as a computer work station or a personal computer (PC), without departing from the scope of the present teachings.

Generally, the channel emulator 130 implements a number of functions. For example, the channel emulator 130 is configured to provide the inversion of the radiation channel matrix Hnm×nm, to provide bi-directional channel models of channels between the base station 120 and multiple user devices UE1 to UEz, respectively, where z is a positive integer, by jointly emulating the antenna element patterns and the channels, and to measure beam dynamics of the base station 120 and multi-user interference among the user devices UE1 to UEz.

More particularly, the channel emulator 130 is configured to receive the measured antenna element patterns from the measurement probe antenna 106, for example, through a base station antenna patterns database 135, and to receive the RF signals coupled to the RF connectors of the base station 120 from the coupling probe antennas 115-11 to 115-*xy*. In the depicted embodiment, the user devices UE1 141, UE2 142, UE3, 143 . . . UEz 144 are emulated by the UE emulator 140, which may be implemented using various types of test instrumentation, such as a signal generator and a signal analyzer, for example. The UE emulator 140 may further include a real-time protocol stack exchanging information with the base station 120 via transmitted and received signals in real-time. In an alternative configuration, user devices UE1 141 to UEz 144 may be actual UEs (not emulated), eliminating the need for the UE emulator 140. Thus, the term "under device" is intended to cover both emulated UEs and actual UEs, unless specified otherwise.

The user devices UE1 141 to UEz 144 (emulated or actual UEs) may be connected by RF cable connection(s) to the channel emulator 130, for example. Alternatively, the user devices UE1 141 to UEz 144 may be located in another anechoic chamber, in which case the connections between the user devices UE1 141 to UEz 144 and the channel emulator 130 are OTA connections. Accordingly, the user devices UE1 141 to UEz 144 are connected to the channel emulator via RF connections or over-the-air connections. An example of the OTA connection in a chamber described in commonly owned application docket number 20180244-01 to Hong-wei Kong et al., the corresponding disclosure entitled "System and Approach to Test the End to End Performance of Mobile User Equipment Communicating with Massive MIMO Base Stations using Beam Forming Dynamically," which is hereby incorporated by reference in its entirety. Antenna patterns from the user devices UE1 141 to UEz 144 may be stored in the UE antenna patterns database 136. The UE antenna patterns may also be measured inside a radiated two-stage OTA test system via the UE antenna pattern measurement and report functionality, or The UE antenna patterns may be simulated using electromagnetic simulation software, for example.

Whether using the emulated or actual UEs, the channel emulator 130 jointly emulates the measured antenna element patterns of the antenna elements 125-11 to 125-*nm*, the bi-directional channel models, and the UE antenna patterns of the user devices UE1 141 to UEz 144 to provide bi-directional spatial channel emulation for each of the user devices UE1 141 to UEz 144 or the actual UEs. The joint emulation, which is performed entirely by the channel emulator 130, avoids spatial emulation inside the anechoic chamber 105, and enables measurement by the channel emulator 130 of beam dynamics of the antenna elements 125-11 to 125-*nm* in the base station antenna array 125. The joint emulation further enables measurement by the channel emulator 130 of interference among the user devices UE1 141 to UEz 144. The channel emulator 130 may perform joint emulation, for example, following a geometry based channel model, such as 3GPP spatial channel modeling.

Performing the joint emulation within the channel emulator 130 greatly simplifies requirements on the anechoic chamber 105, and can support any kind of channel model with the same channel emulator hardware platform. As the beamforming effects of the base station 120 and the multi-user interferences are all emulated in the channel emulator 130, embedded measurement functionalities may be implemented by the channel emulator 130 to evaluate the beamforming dynamics performance of the base station 120, as well as the effects of the multi-user interference. The test system 100 assumes that each individual antenna element pattern of the antenna elements 125-11 to 125-*nm* can be measured, which may be accomplished when the other antenna elements (having antenna element patterns not being measured) are configured to be independently turned on and off, as mentioned above.

As mentioned above the RF signals are coupled to the coupling probe array 110 to form the high dimension radiation channel matrix indicating channels between the base station antenna array 125 and the coupling probe array 110. In order to couple the RF signals to the coupling probe array 110, the test controller 170 may determine which of the coupling probe antennas 115-11 to 115-xy to associate with the antenna elements 125-11 to 125-nm, respectively. For example, the test controller 170 may determine which of the coupling probe antennas 115-11 to 115-xy to associate with each of the antenna elements 125-11 to 125-nm by determining which of the coupling probe antennas 115-11 to 115-xy has the strongest power with respect to each selected one of the antenna elements 125-11 to 125-nm, respectively. This may be done, for example, by physically adjusting the position of the base station 120 within the anechoic chamber 105 to be in parallel with the coupling probe array 110 such that the long edge of the base station antenna array 125 is in parallel to the long edge of the coupling probe array 110, and the short edge of the base station antenna array 125 is in parallel to the short edge of the coupling probe array 110. The base station antenna array 125 is positioned such that the array center is directly facing the array center of the probe antenna array 110. That is, a line connecting the two array centers is orthogonal to the plane of both arrays.

The transmit antenna elements 125-11 to 125-nm are turned on consecutively, while all remaining ones of the antenna elements 125-11 to 125-nm are turned off. For each of the consecutively turned on antenna elements 125-11 to 125-nm, the one of remaining (unselected) coupling probe antennas 115-11 to 115-xy of the coupling probe array 110 having the highest coupling power is selected to be associated with the consecutively turned on antenna element. The selected one of the coupling probe antennas 115-11 to 115-xy may be marked as selected, so it is not considered for subsequently turned on antenna elements 125-11 to 125-nm. The process continues until each of the base station antenna elements 125-11 to 125-nm has a corresponding selected coupling probe antenna. As a result, the radiation channel matrix Hnm×nm includes the base station antenna elements 125-11 to 125-nm and the corresponding selected ones of the coupling probe antennas 115-11 to 115-xy. Thus, ultimately, each of the antenna elements 125-11 to 125-nm in the base station antenna array 125 is associated with an identified one of the coupling probe antennas 115-11 to 115-xy in the coupling probe array 110.

When the radiation channel matrix Hnm×nm has been determined, the first RF switch 161 selectively connects the identified coupling probe antennas from among the coupling probe antennas 115-11 to 115-xy to the channel emulator 130, e.g., under control of the test controller 170. The selected coupling probe antennas correspond to the antenna elements 125-11 to 125-nm in the base station antenna array 125, respectively, as discussed above, enabling the channel emulator 130 to provide the bi-directional channel models, as indicted by the double arrows between the first RF switch 161 and the channel emulator 130, and between the channel emulator 130 and the user devices UE1 141 to UEz 144 (provided by the UE emulator 140 or actual UEs). That is, for each antenna element of the antenna elements 125-11 to 126-nm, the test controller 170 identifies which of the coupling probe antennas 115-11 to 115-xy that receives an RF signal from that antenna element has the strongest power (highest signal amplitude). The test controller 170 then controls the first RF switch 161 to selectively connect the identified ones of the coupling probe antennas 115-11 to 115-xy having the strongest power to the channel emulator 130.

In addition, the selected coupling probe antennas of the coupling probe antennas 115-11 to 115-xy being selectively connected to the channel emulator 130 by the first RF switch 161 provide a well conditioned radiation channel matrix Hnm×nm for nm selected coupling probe antennas, as mentioned above. A well conditioned radiation channel matrix means that the condition number (the maximum magnitude of the eigen value of the channel matrix over the minimum magnitude of the eigen value) of the channel matrix is larger but very close to 1. This also means that the channel matrix is not ill conditioned and is invertible. The radiation channel matrix Hnm×nm is bi-directional, meaning that the radiation channel matrix element between one base station antenna element and one selected probe antenna element is the same for the uplink and for the downlink.

The well conditioned radiation channel matrix Hnm×nm can be achieved for a number of reasons, enabled by the test system 100. For example, power coupled from a given one of the antenna elements 125-11 to 125-nm in the base station antenna array 125 to a selected one of the coupling probe antennas 115-11 to 115-xy in the coupling probe array 110 is highly related to distance between the base station antenna array 125 and the coupling probe array 110. That is, the closer the given antenna element 125-11 to 125-nm is to the selected coupling probe antenna 115-11 to 115-xy, the higher the coupled power is. As the distance increases, the coupled power drops significantly. In the depicted embodiment, the distance between the base station antenna array 125 and the coupling probe array 110 is very small (e.g., less than about 1 cm), since the coupling probe array 110 is in the reactive field of the base station antenna array 125.

Also, by turning off unselected ones of the antenna elements 125-11 to 125-nm when measuring power of a selected one of the antenna elements 125-11 to 125-nm, discussed above, the radiation channel matrix Hnm×nm will have beneficial characteristics. For example, the main diagonal elements of the radiation channel matrix Hnm×nm are the strongest in the corresponding row and column, and the adjacent diagonal elements have less power than the main diagonal elements. Also, the further the adjacent diagonal element is away from the main diagonal element, the less the power is. With spacing of just a few elements, the power will drop significantly as compared to the main diagonal element because the mutual coupling drops significantly with the distance.

as massive MIMO base station 120, and a coupling probe array 110. The base station 120 (e.g., an LTE base station or 5G base station) has a beamforming circuit, and includes a base station antenna array 125. The base station antenna array 125 includes multiple antenna elements, indicated by illustrative antenna elements 125-11 to 125-nm, Empirical data collected for an illustrative massive MIMO base station (e.g., base station 120), having an 8×8 antenna element base station antenna array (e.g., base station antenna array 125) at half wavelength, demonstrate a well conditioned radiation channel matrix. The results of power measurements at a coupling probe array (e.g., coupling probe array 110) about 1 cm from the massive MIMO base station are provided in Table 1, below, which shows the first row of antenna elements (P11 to P18). The diagonal antenna element entry would be at P11.

TABLE 1

| | Cross coupling | | | | | | | |
| --- | --- | --- | --- | --- | --- | --- | --- | --- |
| | P11 | P12 | P13 | P14 | P15 | P16 | P17 | P18 |
| Power (dBm) | −27 | −35 | −38 | −47 | −50 | −55 | −60 | −67 |

As can be seen in Table 1, the power of the diagonal element (P11) in the radiation channel matrix is larger than the sum of the powers of the other elements (P12 to P18) for the same row. Given that each of the base station antenna array and the probe antenna array has uniform spacing in both directions, it may be inferred that the power of the diagonal element in each row with be similarly higher than the powers of the other elements in the same row of the radiation channel matrix (following selection of the coupling probe antennas, discussed above). Thus, Table 1 shows the radiation channel matrix is a diagonal dominant array, which is invertible and thus well conditioned.

In practice, since the mutual coupling effects are directly related to distance between the base station antenna array 125 and the probe antenna array 115, the process may be simplified by selecting coupling probe antennas 115-11 to 115-xy which are closest to corresponding antenna elements 125-11 to 125-nn, respectively. The coupling probe array 110 may be a wideband antenna array, for example. The same coupling probe array 110 may be used to measure different massive MIMO base stations at different frequencies within the frequency coverage of the coupling probe array 110. In an embodiment, half wavelength spacing of the coupling probe antennas 115-11 to 115-xy is designed for the highest frequency the coupling probe array 110 supports. In another embodiment, the coupling probe array 110 may be designed with less than half wavelength spacing, for example.

The inversion matrix block 131 of the channel emulator 130 provides an nm×nm inversion matrix $H^{-1}$ ($H^{-1}$ nm×nm) of the radiation channel matrix Hn×n to achieve wireless cabling connections between the antenna elements 125-11 to 125-nm in the base station antenna array 125 and the selected coupling probe antennas of the coupling probe antennas 115-11 to 115-xy in the coupling probe array 110. The inversion matrix $H^{-1}$ nm×nm is also bi-directional.

The inversion matrix $H^{-1}$ nm×nm is applied by the channel emulation block 132 of the channel emulator 130 to determine wireless cabling connections between a first reference plane (not shown) at the RF connectors to the base station antenna array 125 and a second reference plane (not shown) inside the channel emulator 130 after the inversion matrix block 131 and before the channel emulation block 132. That is, an internal interface between the inversion matrix block 131 and the channel emulation block 132 provides the second reference plane. Thus, a wireless cable connection is established, starting at the first reference plane and stopping at the second reference plane, corresponding to each of the antenna elements 125-11 to 125-nm in the base station antenna array 125.

The UE antenna patterns of the user devices UE1 141 to UEz 144 are loaded into the channel emulator 130 from the UE antenna patterns database 136, and the measured base station antenna element patterns measured by the measurement probe antenna 106 are loaded at the second reference plane in the channel emulator 130 from the BS antenna patterns database 135 after the inversion matrix has been applied. A bi-directional channel model between each of the user devices UE1 141 to UEz 144 and the base station 120 is determined by the channel emulator 130 to enable modeling performance of multiple users (the user devices UE1 141 to UEz 144). The bi-directional channel models are based on the loaded measured base station antenna element patterns, the loaded UE antenna patterns, and the RF signals coupled from the coupling probe array 110.

In an embodiment, the bi-directional channel models may be dynamic channel models, which incorporate movement of the user devices UE1 141 to UEz 144, which may be moved along predetermined routes, respectively, while being detected at the base station 120. The base station 120 automatically adapts beamforming by the base station antenna array 125 to follow the movement of the user devices UE1 141 to UEz 144. The measured antenna element patterns loaded at the second reference plane, the UE antenna patterns of the user devices UE1 141 to UEz 144, and the determined bi-directional channel models may be jointly emulated to provide bi-directional spatial channel emulation for each of the user devices UE1 141 to UEz 144, enabling measurement by the channel emulator 130 of beam dynamics of the antenna elements 125-11 to 125-nm, as well as interference among the user devices UE1 141 to UEz 144. This likewise enables performance of end-to-end testing using the multiple user devices UE1 141 to UEz 144, either cable conducted or OTA, to test performance of the base station 120. The end-to-end testing includes the corresponding transmitters and receivers of the end devices.

In the depicted embodiment, the test controller 170 includes a user interface (I/F) 171, a processor 172 and a memory 173. The test controller 170 is programmed, in part, to configure the bi-directional channel models for the emulated UEs UE1 141 to UEz 144, and/or actual UEs, respectively, including identifying and selecting coupling probe antennas of the coupling probe antennas 115-11 to 115-xy that measure the strongest RF signals from the antenna elements 125-11 to 125-nm, respectively. The test controller 170 also controls measurement functions inside the channel emulator 130, for example, in response to input by a user through the user I/F 171. The test controller 170 also operates the first RF switch 161 and the second RF switch 162, as discussed above. The test controller 170 may set characteristics of emulated (via the UE emulator 140) or actual user devices UE1 141 to UEz 144, such as individual capabilities, number of antennas, corresponding antenna patterns, geography locations, and the like.

The overall test system 100 may provide a number of performance metrics. For example, the test system 100 may provide uplink and downlink multi-user overall capacity, single user uplink and downlink throughput with interference from other users' interference from the channel emulator 130, and how fast the base station 120 is able to track the users' movements. Such measurement results are collected at system level from the base station 120, for example, by the test controller 170, and also each user report provided by the user devices UE1 141 to UEz 144. Thus, the measurement results are not limited to the measurements in the channel emulator 130.

The test system 100, according to various embodiments, provides a number of advantages over conventional test systems. For example, since the measurement probe antenna 106 is positioned in a mid-field of the base station antenna array 125 and the coupling probe array 110 is positioned in a reactive field of the base station antenna array 125, the anechoic chamber 105 may be much smaller than a conventional far-field anechoic chamber (e.g., about one tenth to about one eighth the size of a conventional far-field anechoic chamber, depending on array size), needed to measure an entire base station array, and still be able to support determinations of the base station beam dynamics and multiple users. Effectively, the anechoic chamber 105 only needs to be large enough to incorporate the far-field for each individual antenna element 125-11 to 125-nm of the base station antenna array 125. Also, the coupling probe array 110 and the emulation of the antenna element patterns in the channel emulator 130 make the test system 100 capable of testing base station beam dynamics and multi-user performance, over-the-air. This enables evaluation of not only baseband RF, but also of base station antenna array 125 radiation performance impact.

As compared to conventional test systems, the test system 100 is very cost effective. It does not require a large, far-field anechoic chamber for the base station or a large probe wall of coupling probe antennas to support the spatial channel emulation. Also, the test system 100 reduces the required number of channels of the channel emulator 130 by emulating the spatial channel environment inside the channel emulator 130. Indeed, the test system 100 is very flexible, supporting different channel scenarios, because all the spatial channel emulation is done inside the channel emulator 130. This is not feasible for conventional test systems that attempt to perform the spatial channel emulation with both the channel emulator and a multi-probe anechoic chamber (MPAC) environment.

Figure 2:
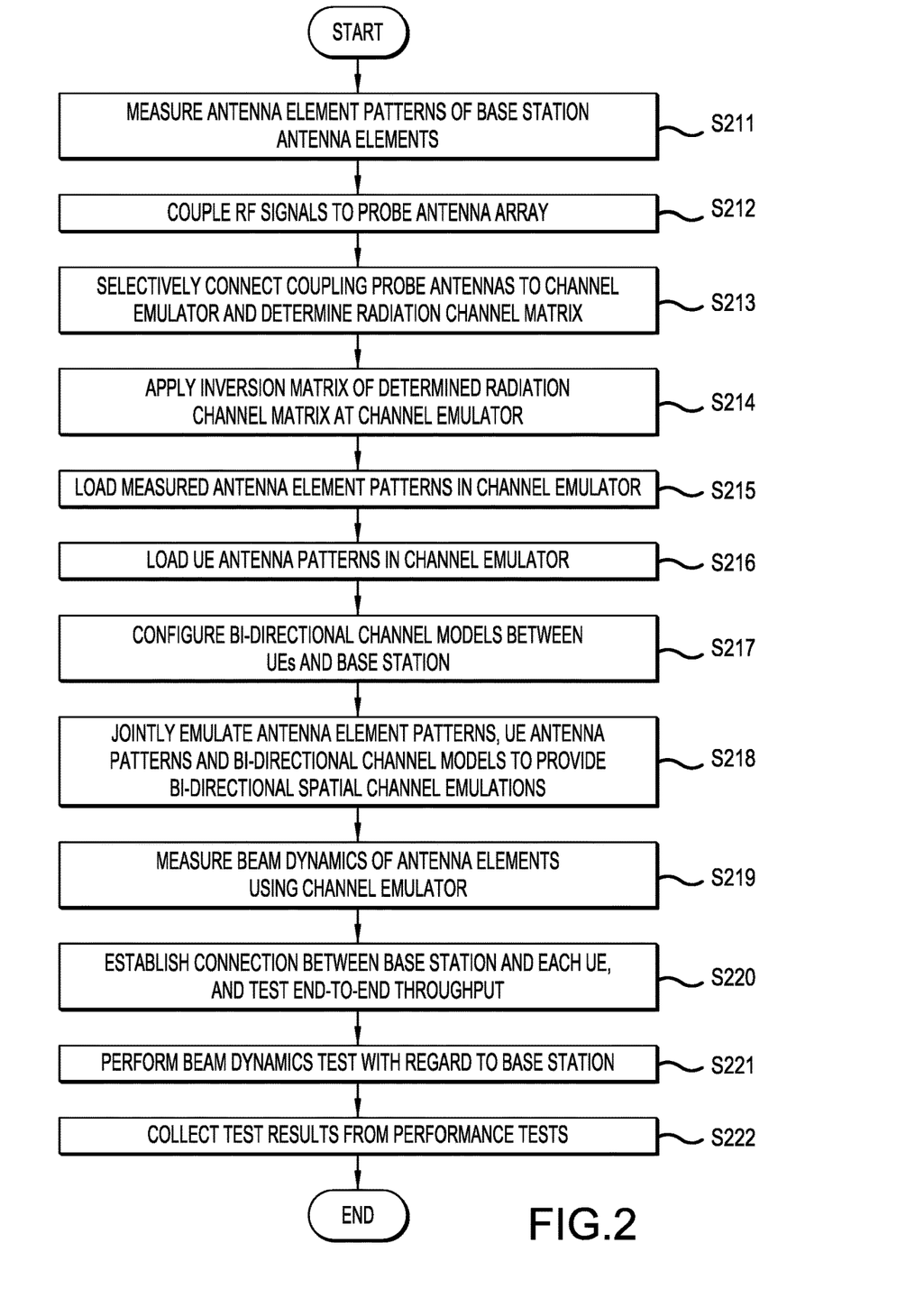
FIG. 2 is a flow diagram showing a method for determining beam dynamics and multi-user performance of a base station, according to a representative embodiment.

FIG. 2 is a flow diagram showing a method for determining beam dynamics and multi-user performance of a base station, according to a representative embodiment. As discussed above, the base station (e.g., base station 120) has base station antenna array (e.g., base station antenna array 125) including multiple antenna elements (e.g., antenna elements 125-11 to 125-$nm$) arranged in a matrix format. The base station is located in an anechoic chamber (e.g., anechoic chamber 105) with a reference antenna (e.g., reference antenna 108) having a fixed position with respect to the base station antenna array, a measurement probe antenna (e.g., measurement probe antenna 106) positioned in a mid-field of the base station array, and a coupling probe array (e.g., coupling probe array 110) including coupling probe antennas (e.g., coupling probe antennas 115-11 to 115-$xy$) in reactive field of the base station array. The coupling probe antennas may likewise be arranged in a matrix format.

Referring to FIG. 2, (complex) antenna element patterns of the antenna elements in the base station antenna array are measured in block S211 using the measurement probe antenna. As mentioned above, the measurement probe antenna is positioned in a mid-field of the base station antenna array. The measurement probe antenna may be selectively connected to a signal generator or a signal analyzer through an RF switch. For example, for receive testing of the antenna element patterns, the RF switch is controlled (e.g., by the test controller 170) to connect the measurement probe antenna to the signal generator, which generates the measurement signals to be transmitted by the measurement probe antenna to the antenna elements in the base station antenna array. The base station reports received signal strength for each of the antenna elements and relative phase between the antenna elements. For transmit testing of the antenna element patterns, the RF switch is controlled (e.g., by the test controller 170) to connect the measurement probe antenna to the signal analyzer, which measures the measurement signals from the measurement probe antenna, as well the reference signal from the reference antenna 108, to obtain amplitude and phase for each of the antenna elements of the base station antenna array for the transmit testing of the antenna element patterns.

A reference signal is provided from the reference antenna as a phase reference. The phase reference may be used to determine phase information of the antenna elements in the base station array for measuring the transmit antenna element patterns, respectively. The phase may be part of the measured complex antenna element patterns loaded into the channel emulator. In an embodiment, the reference signal is used only for the base station transmit antenna element pattern measurement.

RF signals are coupled to the probe antenna array in block S212 to form a high dimension radiation channel matrix indicating channels between the base station antenna array and the coupling probe array. The RF signals may be received from the antenna elements and/or transmitted to the antenna elements in the base station antenna array. Coupling the RF signals to the probe antenna array may include determining coupling probe antennas of the coupling probe array to be associated with the antenna elements in the base station antenna array, respectively, e.g., by the test controller 170. For example, determining which of the coupling probe antennas to associate with each of the antenna elements may include determining which coupling probe antenna of the coupling probe array has the strongest power with respect to each selected antenna element of the base station antenna array, and associating that coupling probe antenna with the selected antenna element. This may be done, for example, by physically adjusting the position of the base station to consecutively locate each antenna element in the base station antenna array to be at a location closest to the coupling probe array (e.g., in the reactive field of the base station antenna array). The coupling probe antenna to be associated with the antenna element positioned closest to the coupling probe array may then be determined, e.g., by the test controller 170. The process is repeated for the antenna elements until each is associated with at least one coupling probe antenna in the coupling probe array. The intention is to assure that the radiation channel matrix between the base station array and the selected probe antennas is well conditioned.

In an illustrative embodiment, determining the coupling probe antennas in the coupling probe array to be associated with the antenna elements in the base station antenna array may include consecutively selecting each antenna element in the base station antenna array, and turning off all remaining unselected antenna elements, respectively, for each selected antenna element. The coupling probe antennas receive an RF signal from the selected antenna element, and the coupling probe antenna with the strongest power from the selected antenna element is identified (and associated with the selected antenna element). The process is repeated until each antenna element in the base station antenna array is associated with an identified coupling probe antenna in the coupling probe array. The radiation channel matrix is determined using each of the identified one coupling probe antenna in the coupling probe array (or, antenna element/coupling probe antenna pair).

In an embodiment, the position of the base station may be physically adjusted to be in parallel with the coupling probe array. Also, the base station antenna array may be positioned such that the array center is directly facing the array center of the coupling probe array. That is, a line connecting the two array centers is orthogonal to the plane of both arrays. The antenna elements are turned on consecutively, while all remaining ones of the antenna elements are turned off, as described above, in order to identify the coupling probe antenna of the coupling probe array that has the strongest power with respect to each turned-on antenna element of the base station antenna array. The identified coupling probe antenna is associated with the turned-on antenna element, and the process is repeated for the other antenna elements.

In block S213, the coupling probe antennas of the coupling probe array are selectively connected to a channel emulator. The coupling probe antennas may be selectively connected to the channel emulator through an RF switch (e.g., first RF switch 161), for example. Connecting the coupling probe antennas to the channel emulator enables the channel emulator to determine a radiation channel matrix (Hnm×nm) corresponding to coupling channels between antenna elements in the base station antenna array and the selected coupling probe antennas. Measurement of the radiation channel matrix is performed for both the uplink and downlink, according to any of a variety of techniques, as would be apparent to one skilled in the art. For example, the uplink measurements of the radiation channel matrix may be performed using simple power measurement functionality in the base station 120, as described, for example, by Ya Jing et al., U.S. Patent Application Publication No. 2017/0373773 (Dec. 28, 2017), which is hereby incorporated by reference in its entirety. Downlink measurements of the radiation channel matrix may be made utilizing orthogonal pilots in the transmitted signal of the base station 120 and/or employing digital, analog and/or hybrid beam forming techniques as described, for example, by "Radiated Power and Phase Calibration of a Multichannel Signal Transmitter," IP.com (Feb. 3, 2017), which is hereby incorporated by reference in its entirety.

An inversion matrix ($H^{-1}$ nm×nm) of the determined radiation channel matrix is applied by the channel emulator in block S214 to determine wireless cabling connections between a first reference plane at the RF connectors to the base station antenna array of the base station and a second reference plane inside the channel emulator after the inversion matrix. Thus, a wireless cable connection is established, starting at the first reference plane and stopping at the second reference plane, corresponding to each of the antenna elements in the base station array. The measured antenna element patterns measured by the measurement probe antenna are loaded at the second reference plane in the channel emulator after the inversion matrix has been applied.

In block S215, the measured base station antenna element patterns are loaded into a channel emulator (e.g., channel emulator 130). In block S216, UE antenna patterns of user devices are loaded into the channel emulator. As used herein, the user devices may refer to emulated UEs provided by a UE emulator (e.g., UE emulator 140) or actual UEs, in contact with the channel emulator, as discussed above. The UE antenna patterns of the user devices may be determined, for example, by measuring those user devices in a radiated two-stage (RTS) MIMO OTA chamber or by the electromagnetic simulations of UE antenna design, although other techniques for determining the UE antenna patterns may be incorporated without departing from the scope of the present teachings.

In block S217, a bi-directional channel model is configured between each of the user devices and the base station by the channel emulator for modeling multi-user performance. The bi-directional channel models are based on the loaded base station antenna element patterns, UE antenna patterns and the RF signals coupled to the RF connectors. The bi-directional channel models may be dynamic channel models to incorporate movement of the user devices. For example, dynamic, bi-directional channel models may be determined by moving the UEs along predetermined routes, detecting the movement of the user devices at the base station, and automatically adapting beamforming by the base station antenna array to follow the movement.

The uploaded, measured antenna element patterns, the uploaded UE antenna patterns, and the determined bi-directional channel models may be jointly emulated in block S218 by the channel emulator to provide bi-directional spatial channel emulation for each of the UEs. The joint emulation means that real channel emulation is turned on after all the configurations. In block S219, the joint emulation enables measurement by the channel emulator of beam dynamics of the antenna elements in the base station antenna array and interference among the user devices.

In block S220, a connection between the base station and each of the user devices may be established, and then the end-to-end throughput of each user device may be logged for both uplink and downlink. The sum of the uplink throughput for all the user devices is the throughput for the base station under the uplink configuration, and the sum of the downlink throughput for all the user devices is the throughput for the base station under the downlink configuration. The base station may be stress tested, for example, by adding more users and changing channels. The maximum uplink and downlink throughput indicate the capacity of the base station for multiple users. The measurement functionalities inside the channel emulator can provide more insights for the performance issue location.

In block S221, a beam dynamics test is performed with regard to the beam dynamics of the base station. As mentioned above, dynamic channel models can be configured on the channel emulator to test the performance of the base station in the dynamic scenarios, such as a user device moving along a certain route. Changes in such a dynamic scenario will be detected by the base station, which adapts the beamforming automatically. The beam dynamics measurement functionalities inside the channel emulator may measure how fast the base station is able to track the beam change, and what kind of cross user interference there may be during the dynamic beamforming besides the end-to-end throughput measurement results.

The base station beam pattern may also be measured in the mid-field of the anechoic chamber (e.g., anechoic chamber 105) using, for example, a mid-field measurement approach described in commonly owned application docket number 20180211-01 to Hong-wei Kong et al., entitled "System and Method for Obtaining Far Field Radiated Power with Multiple Radiated Power measurements in Middle Field," which is hereby incorporated by reference in its entirety. The results may be used to cross check the measurement results inside the channel emulator.

There are other possible system performance measurement steps with different channel model configurations, user device configurations, and/or system performance metrics. Notably, in various embodiments, one or more of blocks S219, S220 and S221 may be omitted, depending on the goals of the testing. Also, the steps indicated by at least blocks S219, S220 and S221 may be performed in parallel, in succession, or some combination thereof, without departing from the scope of the present teachings. In block S222, test results from the various performance tests, including those discussed above with reference to blocks S219, S220 and/or S221, as well as other possible tests of system performance, may be collected (e.g., by the test controller 170), and a summarized test report for the test system may be generated, based on the collected test results. All or a portion of the summarized test report may be displayed on a display (not shown) coupled to the test controller 170 through a display interface.

The channel emulator 130 and the test controller 170 (e.g., the processor 172), as well as any other component requiring processing capabilities, such as the UE emulator 140, may be implemented using one or more processors, such as a computer processor, ASICs, FPGAs, or combinations thereof, using software, firmware, hard-wired logic circuits, or combinations thereof. A computer processor, in particular, may be constructed of any combination of hardware, firmware or software architectures, and may include its own memory (e.g., nonvolatile memory) for storing executable software/firmware executable code that allows it to perform the various functions. In an embodiment, the computer processor may comprise a CPU, for example, executing an operating system. Also, in an embodiment, the functionality of the test controller 170 and/or the channel emulator 130 may be implemented as a computer program or computer software and/or instructions executable by a separate computing device, such as a computer work station or a PC, without departing from the scope of the present teachings. All or a portion of the steps indicated in FIG. 2 may be executed by the test controller 170 and/or the channel emulator 130.

One or more memories (e.g., memory 173, as well as BS antenna patterns database 135 and UE antenna patterns database 136) may be further provided in order to store software and/or programs executable by the processor (e.g., processor 172), as well as data, such as data collected from the coupling probe array 110, the base station 120, the channel emulator 130 and/or the UE emulator, as well as other sources of information. The memories may be implemented by any number, type and combination of random access memory (RAM) and read-only memory (ROM), for example, and may store various types of information, such as computer programs and software algorithms executable by the one or more processors (and/or other components), as well as raw data and/or testing and measurement data storage, for example. The various types of ROM and RAM may include any number, type and combination of computer readable storage media, such as a disk drive, an electrically programmable read-only memory (EPROM), an electrically erasable and programmable read only memory (EEPROM), a CD, a DVD, a universal serial bus (USB) drive, and the like, which are tangible and non-transitory storage media (e.g., as compared to transitory propagating signals).

The various components, structures, parameters and methods are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:

1. A system for determining beam dynamics and multi-user performance of a base station, the base station having a base station antenna array comprising a plurality of antenna elements, the system comprising:
  a measurement probe antenna positioned in a mid-field of the base station antenna array, the measurement probe antenna providing measurement signals for measuring antenna element patterns of the plurality of antenna elements in the base station antenna array, respectively;
  a coupling probe array, comprising a plurality of coupling probe antennas, positioned in a reactive field of the base station antenna array for coupling radio frequency (RF) signals received from and/or transmitted to the plurality of antenna elements in the base station antenna array over-the-air, to selected coupling probe antennas of the plurality of coupling probe antennas to form a high dimension radiation channel matrix between the base station antenna array and the coupling probe array;
  an anechoic chamber housing at least the base station, the measurement probe antenna, a reference antenna and the coupling probe array;
  a channel emulator configured to receive the measured antenna element patterns from the measurement probe antenna, to receive the RF signals coupled to the selected coupling probe antennas, to provide bi-directional channel models of channels between the base station and a plurality of user devices, respectively, based on the received RF signals, and to jointly emulate the measured antenna element patterns, user equipment (UE) antenna patterns of the user devices, and the bi-directional channel models to provide bi-directional spatial channel emulation for each of the plurality of user devices, enabling measurement by the channel emulator of beam dynamics of the plurality of antenna elements in the base station antenna array and interference among the plurality of user devices; and
  an RF switch configured to selectively connect the selected coupling probe antennas of the plurality of coupling probe antennas to the channel emulator, the selected coupling probe antennas corresponding to the plurality of antenna elements in the base station antenna array, respectively, enabling the channel emulator to provide the bi-directional channel models,
  wherein each of the selected coupling probe antennas is determined for each of the antenna elements as having a strongest power from among the plurality of coupling probe antennas with respect to an antenna element of the plurality of antenna elements.

2. The system of claim 1, wherein the selected coupling probe antennas selectively connected to the channel emulator by the RF switch provide a well conditioned radiation channel matrix, wherein the radiation channel matrix is bi-directional.

3. The system of claim 2, wherein the channel emulator is further configured to provide an inversion matrix of the radiation channel matrix to achieve wireless cabling connections between the antenna elements in the base station antenna array and the plurality of coupling probe antennas of the coupling probe array, wherein the inversion matrix is bi-directional.

4. The system of claim 1, wherein the user devices are connected to the channel emulator via RF connections or over-the-air connections.

5. The system of claim 1, further comprising:
  a signal generator configured for generating the measurement signals to be transmitted by the measurement probe antenna to the antenna elements in the base station antenna array for receive testing of the antenna element patterns, wherein the base station reports a received signal strength for each antenna element and relative phase between antenna elements;
  a signal analyzer configured for measuring the measurement signals from the measurement probe antenna and a reference signal from a reference antenna to obtain amplitude and phase for each of the antenna elements of the base station antenna array for transmit testing of the antenna element patterns; and
  another RF switch configured to selectively connect the measurement probe antenna to the signal generator for the receive testing and to the signal analyzer for the transmit testing of the antenna element patterns.

6. The system of claim 1, wherein a distance between the measurement probe antenna and the base station is in a far-field of each of the plurality of antenna elements, and in a near-field of the base station antenna array.

7. The system of claim 1, further comprising:
a multi-dimensional positioner configured to dynamically position the base station so that each antenna element in the base station antenna array is positioned at a rotation center of the anechoic chamber for a corresponding antenna element pattern measurement.

8. The system of claim 1, wherein an antenna element pattern of each antenna element in the base station antenna array is measured without the antenna element being positioned at a rotation center of the anechoic chamber by mathematically correcting for offset of the antenna element from the rotation center.

9. The system of claim 1, wherein the reactive field is within distance (R) of the plurality of antenna elements in the base station antenna array, and wherein R=0.62sqrt($D^3/\lambda$), D being an antenna array aperture size and $\lambda$ being wavelength of the RF signals.

10. The system of claim 1, wherein a phase difference between each of the measurement signals from the measurement probe antenna and the reference signal from the reference antenna is a phase difference for an antenna element of the plurality of antenna elements at different directions with a fixed offset.

11. The system of claim 1, further comprising:
a test controller comprising a user interface, the test controller being programmed to configure the bi-directional channel models for the user devices and/or to configure measurement functions inside the channel emulator in response to input by a user through the user interface.

12. The system of claim 1, further comprising: a reference antenna having a fixed position with respect to the base station antenna array, the reference antenna providing a reference signal used as a phase reference for determining phase information of the plurality of antenna elements of the base station array for measuring the antenna element patterns, respectively.

13. A method for determining beam dynamics and multi-user performance of a base station, the base station having a base station antenna array comprising a plurality of antenna elements, and being located in an anechoic chamber with a measurement probe antenna positioned in a mid-field of the base station array, and a coupling probe array comprising a plurality of coupling probe antennas in a reactive field of the base station array, the method comprising:
measuring antenna element patterns of the plurality of antenna elements in the base station antenna array using the measurement probe antenna;
coupling radio frequency (RF) signals received from and/or transmitted to the plurality of antenna elements in the base station antenna array to the probe antenna array to form a high dimension radiation channel matrix between the base station antenna array and the coupling probe array;
selectively connecting coupling probe antennas of the coupling probe antenna, array to a channel emulator, and determining at the channel emulator the high dimension radiation channel matrix corresponding to coupling channels between antenna elements in the base station antenna array and the selected coupling probe antennas;
applying an inversion matrix of the determined high dimension radiation channel matrix inside the channel emulator to determine wireless cabling connections between the base station antenna array of the base station and the channel emulator, wherein the measured antenna element patterns are loaded at a second reference plane in the channel emulator after applying the inversion matrix;
loading user equipment (UE) antenna patterns of a plurality of user devices into the channel emulator; and
configuring a bi-directional channel model between each user device of the plurality of user devices and the base station based on the UE antenna patterns and the RF signals coupled to RF connectors for modeling multi-user performance.

14. The method of claim 13, wherein the wireless cabling connections are between a first reference plane at the base station antenna array station and the second reference plane inside the channel emulator after the inversion matrix.

15. The method of claim 14, wherein a wireless cable connection starts at the first reference plane and stops at the second reference plane for each of the plurality of antenna elements in the base station antenna array.

16. The method of claim 13, further comprising:
determining dynamic channel models between the user devices and the base station by moving the user devices along predetermined routes, detecting the movement of the user devices at the base station, and automatically adapting beamforming by the base station antenna array to follow the movement.

17. The method of claim 13, wherein determining the coupling probe antennas in the coupling probe array comprises:
physically adjusting a position of the base station to locate each antenna element in the base station antenna array to be close to the coupling probe antenna of the coupling probe array, and determining each coupling probe antenna which is closest to one antenna element in the base station antenna array.

18. The method of claim 13, wherein coupling the RF signals to the probe antenna array comprises determining coupling probe antennas of the coupling probe array to be associated with the antenna elements in the base station antenna array to assure that the high dimension radiation channel matrix between the base station array and the selected probe antennas is well conditioned.

19. The method of claim 18, wherein determining the coupling probe antennas in the coupling probe array comprises:
consecutively selecting each antenna element in the base station antenna array, and turning off remaining unselected antenna elements;
identifying one coupling probe antenna of the coupling probe array with a strongest power from the selected antenna element, until each antenna element in the base station antenna array is associated with an identified one coupling probe antenna in the coupling probe array; and
determining the high dimension radiation channel matrix using each of the identified coupling probe antennas in the coupling probe array.

20. The method of claim 13, further comprising:
jointly emulating the measured antenna element patterns, the UE antenna patterns, and the configured bi-directional channel models to provide bi-directional spatial channel emulation for each of the plurality of user devices, enabling measurement by the channel emulator of beam dynamics of the plurality of antenna elements in the base station antenna array and interference among the plurality of user devices.

* * * * *

UNITED STATES PATENT AND TRADEMARK OFFICE
CERTIFICATE OF CORRECTION

PATENT NO.        : 10,935,584 B2
APPLICATION NO.   : 16/551240
DATED             : March 2, 2021
INVENTOR(S)       : Hong-Wei Kong et al.

Page 1 of 1

It is certified that error appears in the above-identified patent and that said Letters Patent is hereby corrected as shown below:

In the Claims

In Column 19, Line 43, in Claim 13, after "station" insert -- antenna --.

In Column 19, Line 56, in Claim 13, delete "antenna," and insert -- antenna --, therefor.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*